(12) United States Patent
Jung et al.

(10) Patent No.: US 6,376,368 B1
(45) Date of Patent: Apr. 23, 2002

(54) METHOD OF FORMING CONTACT STRUCTURE IN A SEMICONDUCTOR DEVICE

(75) Inventors: Soon-moon Jung, Sungnam; Sun-cheol Hong, Incheon; Sang-eun Lee, Yongin, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/630,292

(22) Filed: Aug. 1, 2000

(30) Foreign Application Priority Data

Aug. 5, 1999 (KR) ............................................. 99-32145

(51) Int. Cl.⁷ ...................... H01L 21/4763; H01L 21/44
(52) U.S. Cl. ........................ 438/639; 438/627; 438/628; 438/630; 438/643; 438/647; 438/649; 438/664
(58) Field of Search ................................. 438/627–631, 438/637–640, 642, 643, 645, 647, 648, 649, 660–664

(56) References Cited

U.S. PATENT DOCUMENTS

| | | | | |
|---|---|---|---|---|
| 5,780,348 A | * | 7/1998 | Lin et al. | 438/303 |
| 5,969,422 A | * | 10/1999 | Ting et al. | 257/762 |
| 6,136,697 A | * | 10/2000 | Wu | 438/648 |

* cited by examiner

Primary Examiner—John F. Niebling
Assistant Examiner—Ha Nguyen
(74) Attorney, Agent, or Firm—Mills & Onello LLP

(57) ABSTRACT

A method of forming a contact structure in a semiconductor device is provided. In this method, a semiconductor layer, an ohmic metal layer, and a barrier metal layer are formed on the surface of a semiconductor substrate on which a metal contact hole has been formed. A compound material layer having a uniform thickness is formed on the bottom, sidewalls and lower corners of the contact hole by thermally reacting the semiconductor layer with the ohmic metal layer. Accordingly, when the contact hole exposes an impurity layer and portions of an isolation layer adjacent to the impurity layer, the junction leakage current characteristics of the impurity layer and a contact resistance are improved.

22 Claims, 8 Drawing Sheets

METHOD OF FORMING CONTACT STRUCTURE IN A SEMICONDUCTOR DEVICE

BACKGROUND OF THE INVENTION

1. Field of the Invention

The present invention relates to a method of fabricating semiconductor devices, and more particularly, to a method of forming a contact structure of a semiconductor device.

2. Description of the Related Art

With the increase in the integration level or density of semiconductor devices, MOS transistors have become smaller, and the aspect ratios of a contact holes, i.e., the ratio of the lengths of the holes to their widths, increase. When the size (channel length) of a MOS transistor deceases, a short channel effect results such that the electrical characteristics of MOS transistors are degraded. Thus, an impurity layer, such as the source/drain region of a MOS transistor, which is used in highly-integrated semiconductor devices, must be formed to be very thin. However, when the junction depth of an impurity layer is thinly formed, a junction spiking phenomenon occurs in which metal atoms within a metal interconnection, which contacts the impurity layer via a contact hole, penetrate into a semiconductor substrate below the impurity layer.

Accordingly, recent techniques for solving the junction spiking problem by interposing a barrier metal layer and an ohmic metal layer between a metal interconnection and an impurity layer are being prevalently used for highly-integrated semiconductor devices. Also, the barrier metal layer and the ohmic metal layer are being widely used to form a multi-layered metal interconnection. That is, a technique of interposing an ohmic metal layer and a barrier metal layer between a lower metal interconnection exposed by a via hole and an upper metal interconnection which contacts the lower metal interconnection, is being prevalently used.

Also, to increase the integration level of a semiconductor device, the size of a pattern formed in a predetermined region of a semiconductor device, for example, the width of a pattern which defines an impurity layer which is formed in the cell array region or the core region of the semiconductor device, must be as narrow as the width of a pattern depending on the minimum design rule. At this time, when a contact hole is formed on the impurity layer, the bottom area of the contact hole is limited within the width of the impurity layer, thus making it difficult to improve contact resistance. Hence, a process for maximizing the surface area of an impurity layer that is exposed by a contact hole, by forming the contact hole for exposing the impurity layer and also part of an isolation region adjacent to the impurity layer, is being developed.

FIG. 1 is a layout diagram of a metal contact structure which is commonly used in the present invention and in the prior art. Here, a region indicated by reference character a denotes a region in which a first active region 1a and a first metal contact hole 3a for exposing both the first active region 1a and a part of the isolation regions adjacent to the first active region 1a are laid out. A region indicated by reference character b denotes a region in which a second active region 1b and a second metal contact hole 3b for exposing part of the second active region 1b are laid out.

FIGS. 2 through 4 are cross-sectional views, taken along line AA' of FIG. 1, for illustrating a conventional method of forming a metal contact structure. Here, a portion indicated by reference character a denotes a portion in which the first metal contact hole 3a of FIG. 1 is formed, and a portion indicated by reference character b denotes a portion in which the second metal contact hole 3b of FIG. 1 is formed.

Referring to FIG. 2, an isolation layer 13 for defining an active region is formed on a predetermined region of the semiconductor substrate 11. The isolation layer 13 is formed by forming a trench through etching of the predetermined region of the semiconductor substrate 11 and filling the trench with an insulating layer such as a silicon oxide layer. First and second impurity layers 15a and 15b are formed by implanting impurities having a different conductivity type than the conductivity type of the semiconductor substrate 11, such as N-type or P-type impurities, into the surface of the active region between adjacent isolation layers 13. The first impurity layer 15a is narrower than the second impurity layer 15b. An inter;-dielectric layer 17 is formed on the entire surface of the semiconductor substrate 11 on which the first and second impurity layers 15a and 15b have been formed.

Referring to FIG. 3, first and second metal contact holes H1 and H2 for exposing the first and second impurity layers 15a and 15b, respectively, are formed by patterning the inter-dielectric layer 17. The first metal contact hole H1 is formed so that a portion of the isolation layer 13 adjacent to the first impurity layer 15a is exposed, in order to maximize the area of the first impurity layer 15a that is exposed. At this time, the isolation layer 13 is also etched, resulting in a recessed region which exposes the sidewalls of the first impurity layer 15a. When over-etching is performed to pattern the first and second metal contact holes H1 and H2, recessed regions, which expose the sidewalls of the first impurity layer 15a and also the semiconductor substrate 11 portion below the first impurity layer 15a, may be formed.

Next, an ohmic metal layer 19 and a barrier metal layer 21 are sequentially formed on the entire surface of the semiconductor substrate on which the first and second metal contact holes H1 and H2 have been formed. The ohmic metal layer 19 and the barrier metal layer 21 are formed of titanium and titanium nitride, respectively. A sputtering process is generally used to form the ohmic metal layer 19 and the barrier metal layer 21. The ohmic metal layer 19 portion and the barrier metal layer 21 portion deposited on the bottoms and sidewalls of the first and second metal contact holes H1 and H2, respectively, are thinner than those deposited on the upper surface of the inter-dielectric layer 17, due to the characteristics of the sputtering process. In particular, as the aspect ratios of the first and second metal contact holes H1 and H2 increase, the step coverages of the ohmic metal layer 19 and the barrier metal layer 21 formed by the sputtering process become poor. Thus, when the ohmic metal layer 19 and the barrier metal layer 21 are formed after a metal contact hole having a high aspect ratio is formed, the ohmic metal layer 19 portion and the barrier metal layer 21 portion at the lower corners C1 and C2 of the first and second metal contact holes H1 and H2 are very thin, as shown in FIG. 3. The ohmic metal layer 19 portions at the lower corners C1 of the first metal contact hole H1 contact the sidewalls of the first impurity layer 15a, and also may directly contact the semiconductor substrate 11.

Referring to FIG. 4, the resultant structure on which the ohmic metal layer 19 and the barrier metal layer 21 have been formed is thermally treated to react the ohmic metal layer 19 with the impurity layers 15a and 15b. Thus, first and second metal silicide Layers 19a and 19b are formed on the first and second impurity layers 15a and 15b, respectively. Here, the edges of the first metal silicide layer 19a formed on the first impurity layer 15a can make contact with the semiconductor substrate 11 as shown in FIG. 4. Consequently, when a reverse bias is applied between the first impurity layer 15a and the semiconductor substrate 11, the amount of junction leakage current significantly increases on account of the first metal silicide layer 19a, causing malfunction of the device.

Next, a metal layer 23 for filling the first and second contact holes H1 and H2, for example, a tungsten layer, is formed on the entire surface of the semiconductor substrate on which the first and second metal silicide layers 19a and 19b have been formed. The metal layer 23, that is, the tungsten layer, for forming a contact plug, is formed by low pressure chemical vapor deposition (LPCVD) in which $WF_6$ gas is used as a source gas. At this time, fluorine (F) decomposed from the $WF_6$ gas passes through portions of the barrier metal layer 21 at the lower corners C1 and C2 of the first and second metal contact holes H1 and H2, particularly, at the lower corner C2 of the second metal contact hole H2, and reacts with portions of the ohmic metal layer 19 at the edges of the second metal silicide layer 19b. Thus, metal fluoride layers I, for example, titanium fluoride layers TiF, are formed on the upper surfaces of the edge portions of the second metal silicide layer 19b. The metal fluoride layer I is insulating, so that it is a factor in increasing the contact resistance of the second metal contact hole. This increase in the contact resistance becomes more serious with a reduction in the size (i.e., the diameter) of a metal contact hole.

FIGS. 5 and 6 are cross-sectional views illustrating another conventional method of forming a metal contact structure. Here, the same reference numerals as those used in FIGS. 2 through 4 denote the same items. In the method of forming a metal contact structure illustrated by FIGS. 5 and 6, a lower portion below the contact hole is not an impurity layer as shown in FIGS. 2 through 4, but a conductive layer pattern which includes metal.

Referring to FIG. 5, an insulative layer 17 is formed on a semiconductor substrate 11, and a lower interconnection 31, which is a metal polycide pattern containing a refractory metal or a doped polysilicon pattern, is formed on a predetermined area of the insulative layer 17. An inter-dielectric layer 33 is formed on the entire surface of the semiconductor substrate on which the lower interconnection 31 has been formed. The inter-dielectric layer 33 is patterned to form a metal contact hole which exposes a predetermined area of the lower interconnection 31. An ohmic metal layer 19' and a barrier metal layer 21' are sequentially formed on the entire surface of the semiconductor substrate on which the metal contact hole has been formed. Here, the ohmic metal layer 19' and the barrier metal layer 21' are formed by the same method as the method of forming the ohmic metal layer 19 and the barrier metal layer 21, which is described above referring to FIG. 3. Therefore, portions of the ohmic metal layer 19' and the barrier metal layer 21' at the lower corners of the metal contact hole are very thin.

Referring to FIG. 6, a metal layer 23' for filling the metal contact hole, for example, a tungsten layer, is formed on the entire surface of the semiconductor substrate on which the ohmic metal layer 19' and the barrier metal layer 21' have been formed. The metal layer 23', that is, a tungsten layer, for forming a contact plug within the metal contact hole, is formed by LPCVD in which $WF_6$ gas is used as a source gas. At this time, fluorine (F) decomposed from the $WF_6$ gas passes through portions of the ohmic metal layer 19' and the barrier metal layer 21' formed thinly at the lower corners of the metal contact hole, and penetrate into the lower interconnection 31. Thus, when the lower interconnection 31 is a metal polycide pattern, the fluorine F reacts with metal atoms within the metal polycide pattern. Consequently, portions of the lower interconnection below the corners of the metal contact hole are consumed, resulting in voids V. The formation of the voids V below the corners of the metal contact hole reduces the area of contact between the ohmic metal layer 19' and the lower interconnection 31, thus increasing the contact resistance.

When the lower interconnection 31 is a doped polysilicon pattern, fluorine (F) decomposed from the $WF_6$ gas reacts with the ohmic metal layer 19' formed thinly at the lower corners of the metal contact hole as described referring to FIG. 4, that is, with a titanium layer. Consequently, a metal fluoride layer is formed at the lower corners of the metal contact hole, thus increasing the contact resistance.

According to these conventional methods of forming contact structures as described above, the junction leakage current characteristics of an impurity layer are deteriorated, and a contact resistance increases. In particular, increases in the contact resistance are due to the poor step coverages of an ohmic metal layer and a barrier metal layer. In response to this problem, a sputtering process using collimators has been proposed to form an ohmic metal layer and a barrier metal layer, with both having an excellent step coverage within a contact hole. However, this sputtering process is eventually unsatisfactory to improve the step coverages of the ohmic metal layer and the barrier metal layer which are formed within a contact hole having a high aspect ratio. Alternatively, a chemical vapor deposition (CVD) method providing an excellent step coverage can be used to form an ohmic metal layer and a barrier metal layer, for example, a titanium layer and a titanium nitride layer. However, the CVD method has a problem in that chlorine decomposed from $TiCl_4$ gas used as a source gas, corrodes a lower interconnection containing metal. Therefore, a method capable of improving the contact resistance and junction leakage current characteristics of highly-integrated semiconductor devices including a contact hole having a high aspect ratio is required.

SUMMARY OF THE INVENTION

An object of the present invention is to provide a method of forming a contact structure of a semiconductor device by which a contact resistance and junction leakage current characteristics can be enhanced.

In accordance with the invention, there is provided a method of forming a contact structure of a semiconductor device. In accordance with the method of the invention, an inter-dielectric layer is formed on a semiconductor substrate in which a lower interconnection is formed. A contact hole is formed, which exposes a predetermined region of the lower interconnection, by patterning the inter-dielectric layer. A conformal semiconductor layer is formed along the profile of the contact hole on the entire surface of the semiconductor substrate on which the contact hole has been formed. An ohmic layer is formed on the conformal semiconductor layer, and a compound material layer is formed by reacting the conformal semiconductor layer with the ohmic metal layer by thermally treating the ohmic metal layer. An unreacted ohmic metal layer, which did not react with the conformal semiconductor layer, is removed, and a barrier metal layer is formed on the entire surface of the resulting structure.

In one embodiment, the method further includes formation of a contact plug within the contact hole of the thermally-processed semiconductor substrate and formation of a metal interconnection on the contact plug. The contact plug can be a refractory metal layer such as a tungsten layer, and the metal interconnection can be a metal layer such as an aluminum layer or aluminum alloy layer.

Specifically, the method can include forming a refractory metal layer for filling the contact hole on the entire surface of the semiconductor substrate on which the barrier metal layer has been formed. The refractory metal layer, the barrier metal layer and the compound material layer can be planarized until the upper surface of the inter-dielectric layer is exposed, thereby forming a compound material liner and a barrier metal liner on the bottom and sidewalls of the contact hole and simultaneously forming a contact plug for filling the region surrounded by the barrier metal liner. A metal interconnection can then be formed on the contact plug. In one embodiment, the refractory metal layer is formed of tungsten.

A predetermined region of the semiconductor substrate which is exposed by the contact hole is a lower interconnection. The lower interconnection can be an impurity layer obtained by implanting impurities having a different conductivity type than the conductivity type of the semiconductor substrate. These impurities are implanted into an active region defined by an isolation layer. Also, the lower interconnection can be a metal polycide pattern or a doped polysilicon pattern.

When the lower interconnection is an impurity layer, the contact hole may expose an impurity layer and portions of the isolation layer adjacent to the impurity layer together, or expose only a predetermined region of the impurity layer.

In one embodiment, the conformal semiconductor layer can be formed of a material selected from the group consisting of undoped silicon (Si), undoped germanium (Ge) and undoped silicon germanium (SiGe). In one embodiment, the ohmic metal layer and the barrier metal layer are formed of titanium and titanium nitride, respectively. In one embodiment, the semiconductor layer is formed by chemical vapor deposition (CVD) which provides an excellent step coverage.

Rapid thermal processing (RTP) can be performed to react the semiconductor layer with the ohmic metal layer, at 600 to 700° C. under a nitrogen, atmosphere.

In another aspect, the invention is directed to another method of forming a contact structure of a semiconductor device. An isolation layer for defining an active region is formed on a predetermined area of a semiconductor substrate. An impurity layer informed by implanting impurities having a different conductivity type than the conductivity type of the semiconductor substrate onto the surface of the active region. An inter-diaelectric layer is formed on the entire surface of the semiconductor substrate on which the impurity layer has been formed. A metal contact hole, which exposes a predetermined region of the impurity layer and has a recessed region, the recessed region being an etched portion of the isolation layer adjacent exposed impurity layer, is formed by patterning the inter-diaelectric layer. A silicon layer residue, which contacts the sidewalls of the exposed impurity layer, is formed within the recessed region. A metal silicide liner is formed to cover the sidewalls of the metal contact hole, the surface of the exposed impurity layer, and the silicon layer residue. A barrier metal liner is formed on the metal silicide liner. A contact plug is formed for filling the region surrounded by the barrier metal liner.

In one embodiment, the isolation layer is formed by trench isolation.

In one embodiment, the steps of forming the silicon layer residue, the metal silicide liner, the barrier metal liner and the contact plug include sequentially forming a silicon layer and an ohmic metal layer on the entire surface of the semiconductor substrate on which the metal contact hole has been formed. A metal silicide layer is formed by thermally processing the ohmic metal layer to cause the ohmic layer to react with the silicon layer. The silicon layer residue, which contacts the sidewalls of the exposed impurity layer within the recessed region, is simultaneously formed. A barrier metal layer is formed on the entire surface of the semiconductor substrate on which the metal silicide layer and the silicon layer residue have been formed. A refractory metal layer for filling the metal contact hole is formed on the entire surface of the semiconductor substrate on which the barrier metal layer has been formed. The refractory metal layer, the barrier metal layer, and the metal silicide layer are sequentially planarized until the upper surface of the inter-diaelectric layer is exposed. In one embodiment, after the metal silicide layer is formed, a portion of the ohmic metal layer which does not react with the silicon layer upon thermal treatment is removed.

In one embodiment, the silicon layer residue is an undoped polycrystalline silicon layer or an undoped amorphous silicon layer. In one embodiment, the ohmic metal layer and the barrier metal layer are a titanium layer and a titanium nitride layer, respectively.

A metal interconnection can be formed on the contact plug. The contact plug can be a tungsten layer.

In another aspect, the invention is directed to another method of forming a contact structure of a semiconductor device. An isolation layer for defining an active region is formed on a predetermined area of a semiconductor substrate. An impurity layer is formed by implanting impurities having a different conductivity type than the conductivity type of the semiconductor substrate onto the surface of the active region. An inter-diaelectric layer is formed on the entire surface of the semiconductor substrate on which the impurity layer has been formed. A metal contact hole, which exposes a predetermined region of the impurity layer and has a recessed region, the recessed region being an etched portion of the isolation layer adjacent to the exposed impurity layer, is formed by patterning the inter-diaelectric layer. A conformal silicon layer is formed along a profile of the metal contact hole on the entire surface of the semiconductor substrate on which the metal contact hole has been formed. An ohmic metal layer and a barrier metal layer are formed on the silicon layer. The semiconductor substrate on which the barrier metal layer has been formed is thermally processed to form a metal silicide layer obtained by reacting the ohmic metal layer with the silicon layer and simultaneously forming silicon layer residues within the recessed region. A contact plug is formed for filling the metal contact hole surrounded by the barrier metal layer.

In one embodiment, the isolation layer is formed by trench isolation. In one embodiment, the silicon layer is an undoped polycrystalline layer or an undoped amorphous silicon layer. In one embodiment, the ohmic metal layer and the barrier metal layer are a titanium layer and a titanium nitride layer, respectively. A metal interconnection can be formed on the contact plug. The contact plug can be a tungsten layer.

According to the present invention as described above, after a contact hole is formed, a semiconductor layer having an excellent step coverage is interposed between an ohmic metal layer and a portion of a lower interconnection which is exposed by the contact hole. Accordingly, a compound material layer having a uniform thickness, for example, a metal silicide layer, is formed on the sidewalls and bottom of the contact hole upon thermal processing. When the semiconductor layer and the ohmic metal layer are an undoped silicon layer and a titanium layer, respectively, the compound material layer is a titanium silicide layer. The compound material layer can prevent atoms such as fluorine decomposed from $WF_6$ gas which is used as a source gas, from penetrating into the lower interconnection while a refractory metal layer for forming a contact plug, that is, a tungsten layer, is formed within the contact hole. Therefore, increases in contact resistance can be prevented.

Also, when a contact hole for exposing an impurity layer and portions of an isolation layer adjacent to the impurity layer is formed, this can prevent a compound material layer (i.e., a metal silicide layer)formed on the surface of the impurity layer from directly contacting the semiconductor substrate by the silicon layer residue formed within the recessed region. Hence, the characteristics of junction leakage current flowing between the impurity layer and the semiconductor substrate can be improved.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
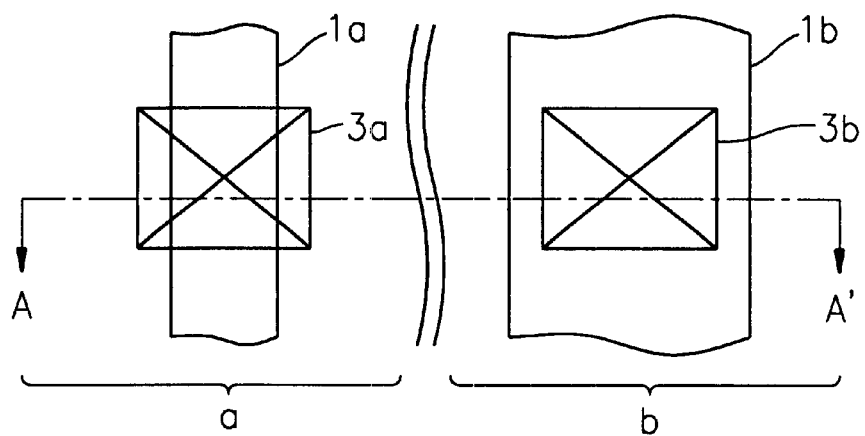
FIG. 1 is a layout diagram illustrating of a contact structure of a semiconductor device which is applied to the present invention.
Figure 2:
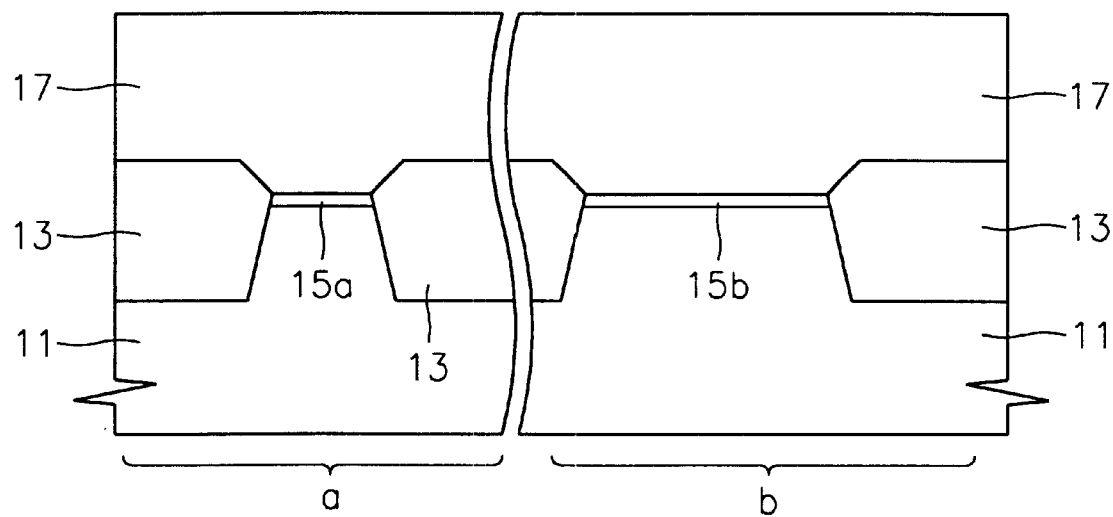
FIGS. 2 through 4 are cross-sectional views illustrating a conventional method of forming a metal contact structure using photo masks on which the layout view of FIG. 1 has been drawn.
Figure 3:
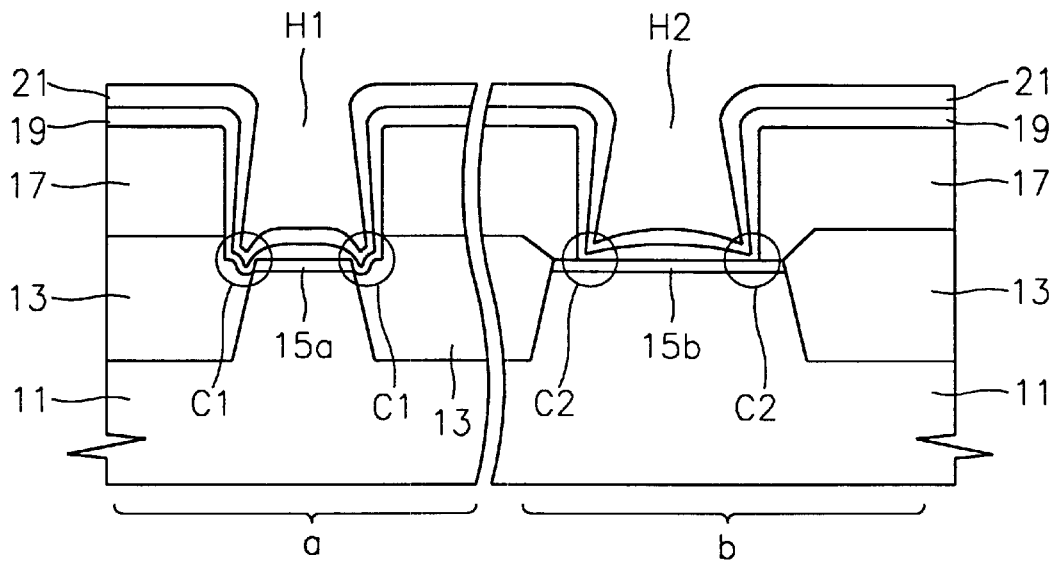
Figure 4:
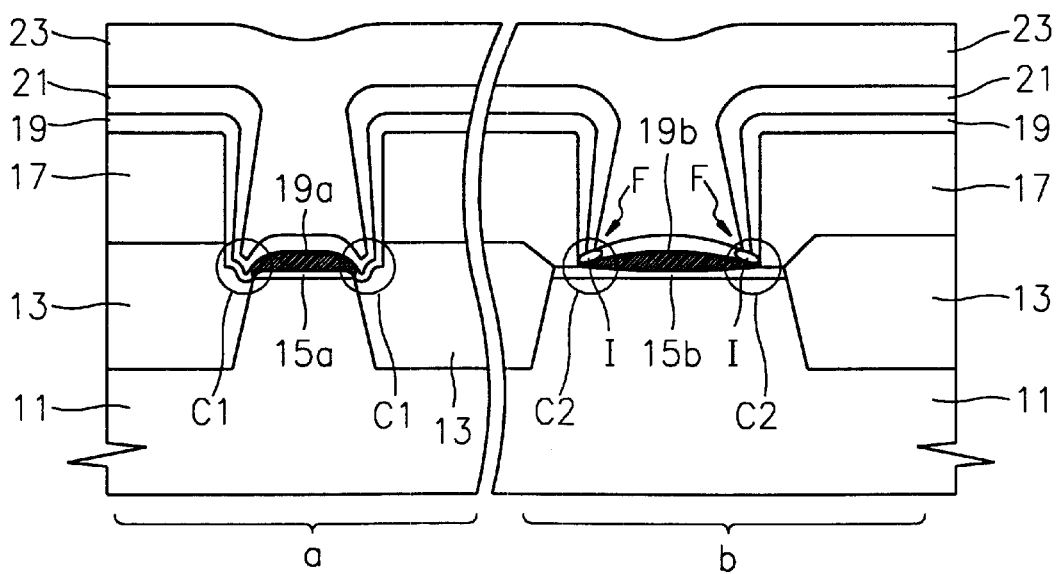
Figure 5:
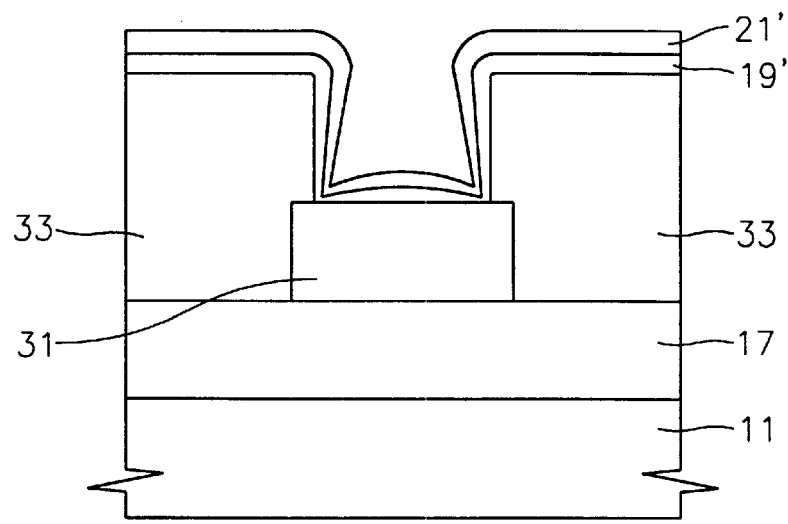
FIGS. 5 and 6 are cross-sectional views illustrating another conventional method of forming a metal contact structure.
Figure 6:
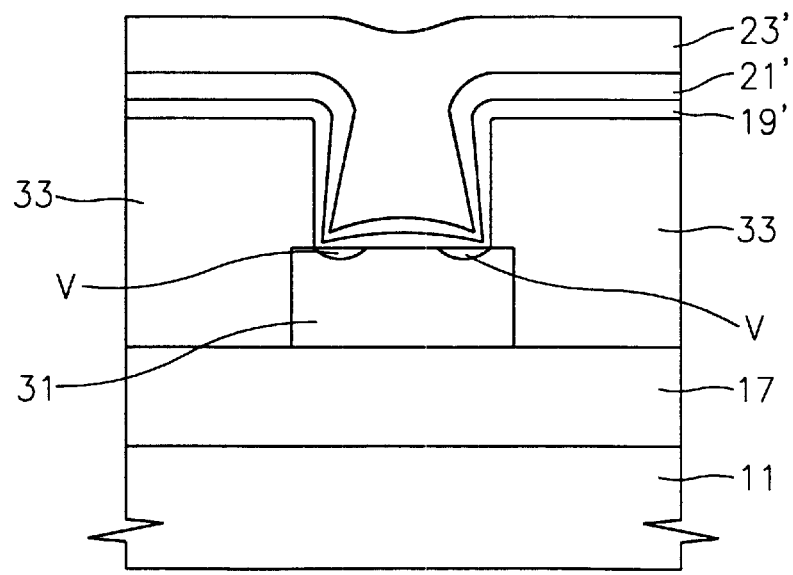

Hereinafter, preferred embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In the drawings, the thicknesses of layers or regions are exaggerated for clarity. Also, when it is written that a layer is formed "on" another layer or a substrate, the layer can be formed directly on the other layer or the substrate, or other layers can intervene therebetween.

In FIGS. 7 through 11, which are cross-sectional views taken along line AA' of FIG. 1, for illustrating a method of forming a metal contact structure according to an embodiment of the present invention, reference characters a and b indicate a region in which the first metal contact hole 3a of FIG. 1 is formed, and a region in which the second metal contact hole 3b of FIG. 1 is formed, respectively.

Figure 7:
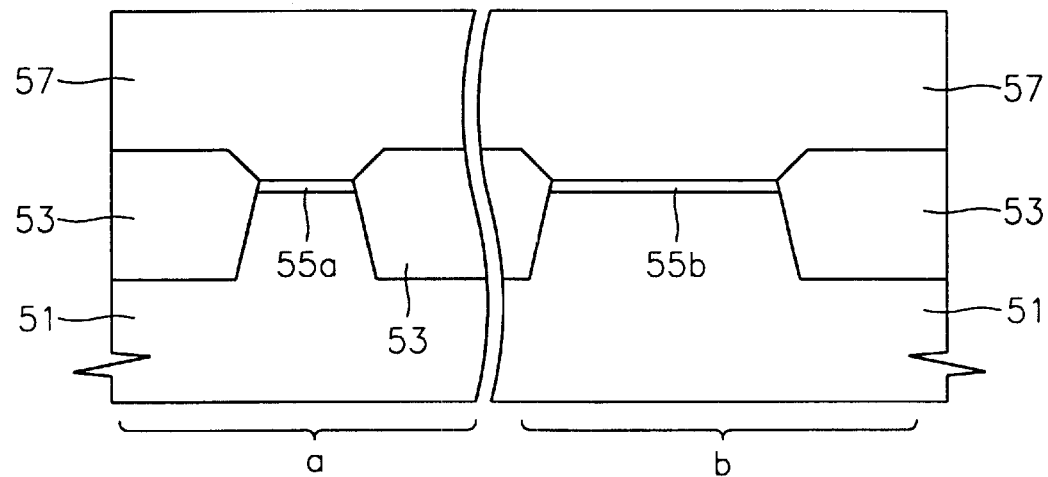
FIGS. 7 through 11 are cross-sectional views illustrating a method of forming a metal contact structure using photo masks on which the layout view of FIG. 1 has been drawn, according to an embodiment of the present invention.

Referring to FIG. 7, an isolation layer 53 is formed on a predetermined area of a semiconductor substrate 51 by trench isolation. The isolation layer 53 is an insulative layer, for example, a chemical vapor deposited (CVD) silicon oxide layer. Impurities having a different conductivity type to the conductivity type of the semiconductor substrate 51 are implanted into the active region between adjacent isolation layers 53, thereby forming impurity layers 55a and 55b. The impurity layers 55a and 55b are resistors or the source/drain regions of a MOS transistor. The first impurity layer 55a has a narrow width corresponding to the minimum design rule, and the second impurity layer 55b is wider than the width of the first impurity layer 55a. An inter-dielectric layer 57 is formed on the entire surface of a semiconductor substrate on which the impurity layers 55a and 55b have been formed. The inter-dielectric layer 57 can be a BPSG layer, which reflows at 800° C. to 900° C., or a silicon oxide layer, which is planarized by chemical mechanical polishing (CMP).

Figure 8:
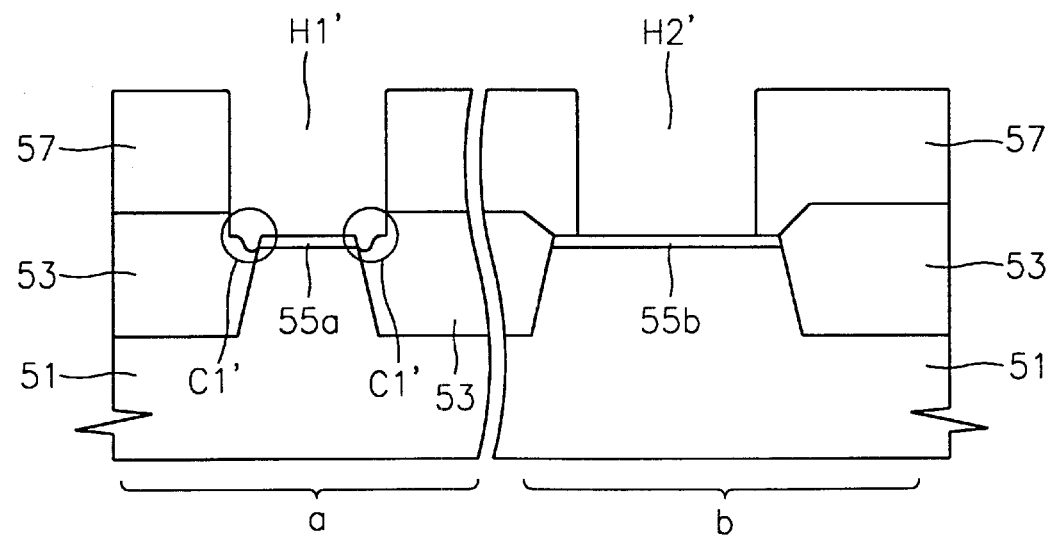

Referring to FIG. 8, the inter-dielectric layer 57 is patterned to form first metal contact hole H1' for exposing the first impurity layer 55a and a second metal contact hole H2' which exposes the second impurity layer 55b. The first metal contact hole H1' exposes the first impurity layer 55a and also a portion of the isolation layer 53 adjacent to the first impurity layer 55a to maximize the area of the first impurity layer 55a that is exposed. Accordingly, the portion of the isolation layer 53 adjacent to the first impurity layer 55a is etched, resulting in recessed regions at the lower comers C1' of the first metal contact hole H1', as shown in FIG. 8. The recessed regions are formed due to over etching which is performed to completely expose the impurity layer when the first and second metal contact holes H1' and H2' are formed. If the over etching is excessively performed, or if the impurity layers 55a and 55b are thin, the sidewalls of the first impurity layer 55a are exposed, and the semiconductor substrate 51 below the first impurity layer 55a may also be exposed.

Figure 9:
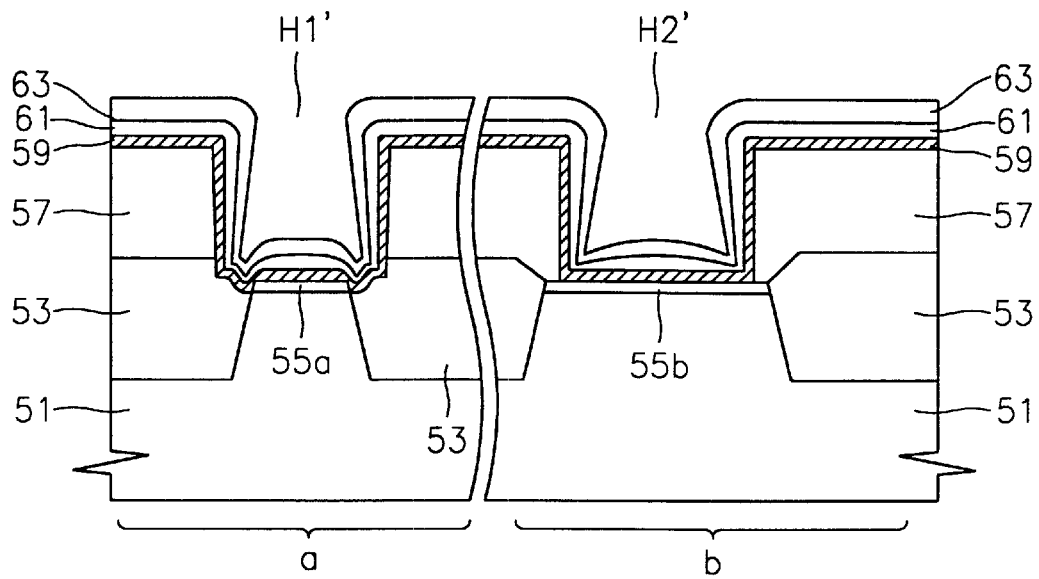

Referring to FIG. 9, a semiconductor layer 59 is formed along the profile of the metal contact holes H1' and H2', on the entire surface of the resultant structure on which the metal contact holes H1' and H2' are formed. The semiconductor layer 59 can be a silicon layer, a germanium layer, or a silicon germanium layer SiGe, and preferably is a silicon layer. Also, it is preferable that the semiconductor layer 59 is formed by low pressure CVD (LPCVD) which provides an excellent step coverage. The silicon layer can be an undoped amorphous silicon layer or an undoped polysilicon layer. Accordingly, the semiconductor layer 59 is formed to have a uniform thickness on the bottom and sidewalls of the metal contact holes H1' and H2' and also on the upper surface of the inter-dielectric layer 57. When the semiconductor layer 59 is a silicon layer, it is preferable that the silicon layer is formed to have a thickness that is 1–2 times the thickness of an ohmic metal layer to be formed in the subsequent process (i.e., the thickness of a portion of the ohmic metal layer formed on the bottom of the metal contact hole).

Next, an ohmic metal layer 61 and a barrier metal layer 63 are sequentially formed on the semiconductor layer 59. In one embodiment, the ohmic metal layer 61 is formed of titanium and the barrier metal layer 63 is formed of titanium nitride. The ohmic metal layer 61 and the barrier metal layer 63 are generally formed by a well-known sputtering process. At this time, the ohmic metal layer 61 and the barrier metal layer 63 provide poor step coverages as shown in FIG. 9.

Figure 10:
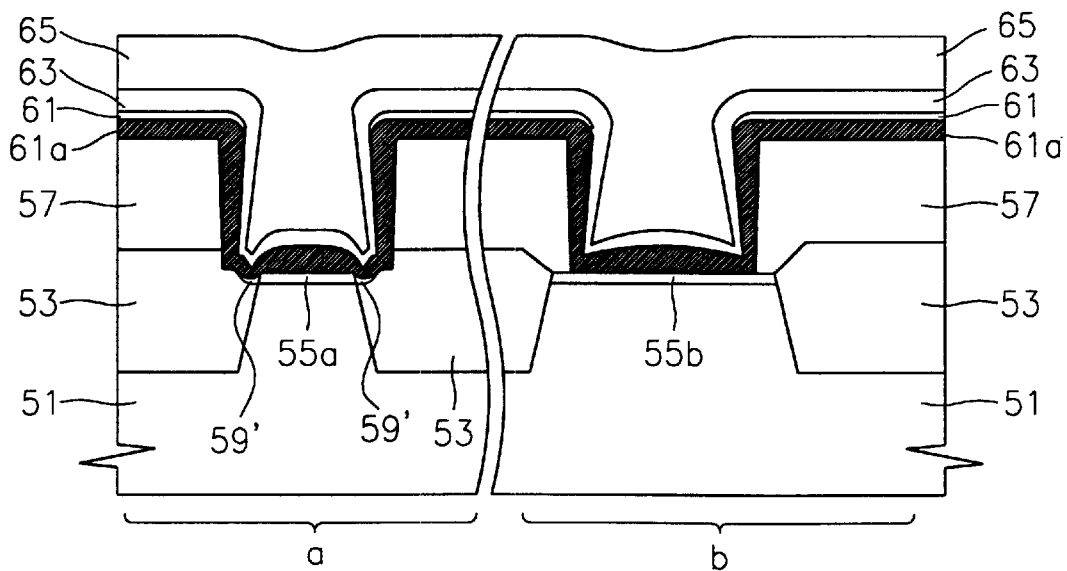

Referring to FIG. 10, the semiconductor substrate on which the barrier metal layer 63 is formed is thermally treated to react the ohmic metal layer 61 with the semiconductor layer 59. Consequently, a compound layer 61a, that is, a metal silicide layer, is formed on the bottoms and sidewalls of the metal contact holes H1' and H2' and also on the upper surface of the inter-dielectric layer 57. When the ohmic metal layer 61and the semiconductor layer 59 are a titanium layer and a silicon layer, respectively, the compound layer 61a is a titanium silicide layer $TiSi_2$. At this time, portions of the ohmic metal layer 61 on the upper; surface of the inter-dielectric layer 57 and on the upper sidewalls of the metal contact holes H1' and H2' may remain unreacted. Also, semiconductor layer residues. 59', which do not react with the ohmic metal layer 61, remain at the lower comers of the first metal contact hole H1', that is, on the recessed regions, since the step coverage of the ohmic metal layer 61 is inferior to that of the semiconductor layer 59. In other words, the ohmic metal layer 61 formed at the lower comers of the first metal contact hole H1', that is, on recessed regions, is thinner than the ohmic metal layer 61 formed on the first impurity layer 55a, whereas the semiconductor layer 59 has a uniform thickness over the entire region it covers. Accordingly, when a thermal treatment is performed to react the semiconductor layer 59 with the ohmic metal layer 61, a smaller amount of semiconductor layer 59 reacts with the ohmic metal layer 61 formed on the recessed regions, than the amount of the semiconductor layer 59 which reacts with the ohmic metal layer 61 on the first impurity layer 55a. Thus, portions of the semiconductor layer 59 formed within the recessed regions remain unreacted with the ohmic metal layer 61. Consequently, direct contact of the compound layer 61a with the semiconductor substrate 51 is prevented.

The thermal treatment can be performed so that all of the semiconductor layer 59 formed on the bottoms of the metal contact holes H1' and H2' reacts, that is, so that no portions of the semiconductor layer 59 formed on the bottoms of the metal contact holes H1' and H2' remain. The thermal treatment is performed at 600° C. to 700° C., preferably, at 650° C., for 20 to 30 seconds under a nitrogen atmosphere.

The thermal treatment may be performed before the barrier metal layer 63 is formed. In this case, it is preferable that the ohmic metal layer 61 which does not react with the semiconductor layer 59, that is, an unreacted ohmic metal layer 61, is removed by a wet-etching solution. Thereafter, the barrier metal layer 63 may be formed, or a new ohmic metal layer and the barrier metal layer 63 may be formed.

Then, a refractory metal layer 65 for filling the first and second metal contact holes H1' and H2', for example, a tungsten layer, is formed on the entire surface of the semiconductor substrate on which the compound layer 61a and the barrier, metal layer 63 have been formed. The refractory metal layer 65, that is a tungsten layer, can be formed by CVD. The process for forming a tungsten layer includes nucleus formation and main deposition. Specifically, in the nucleus formation step, a tungsten nucleus can be formed on the barrier metal layer 63 by reacting $WF_6$ gas with silane $SiH_4$ gas at 465° C. and 4.5 Torr. In the main deposition step, a tungsten layer having a thickness of 3000 Å or greater can be formed to fill the first and second metal contact holes H1' and H2', by reacting $WF_6$ gas with hydrogen gas at 465° C.

and 90 Torr. At this time, most of fluorine atoms decomposed from the $WF_6$ gas are coupled to hydrogen, and HF is thus discharged to the outside. Some of the fluorine atoms can remain within the metal contact holes H1' and H2'. However, according to the present invention, since no unreacted ohmic metal layer exists on the bottoms and sidewalls of the metal contact holes H1' and H2', a TiF layer, obtained by reacting an ohmic metal layer with fluorine residues, as in the prior art, can be prevented from being formed at the lower comers of the metal contact holes H1' and H2'.

Figure 11:
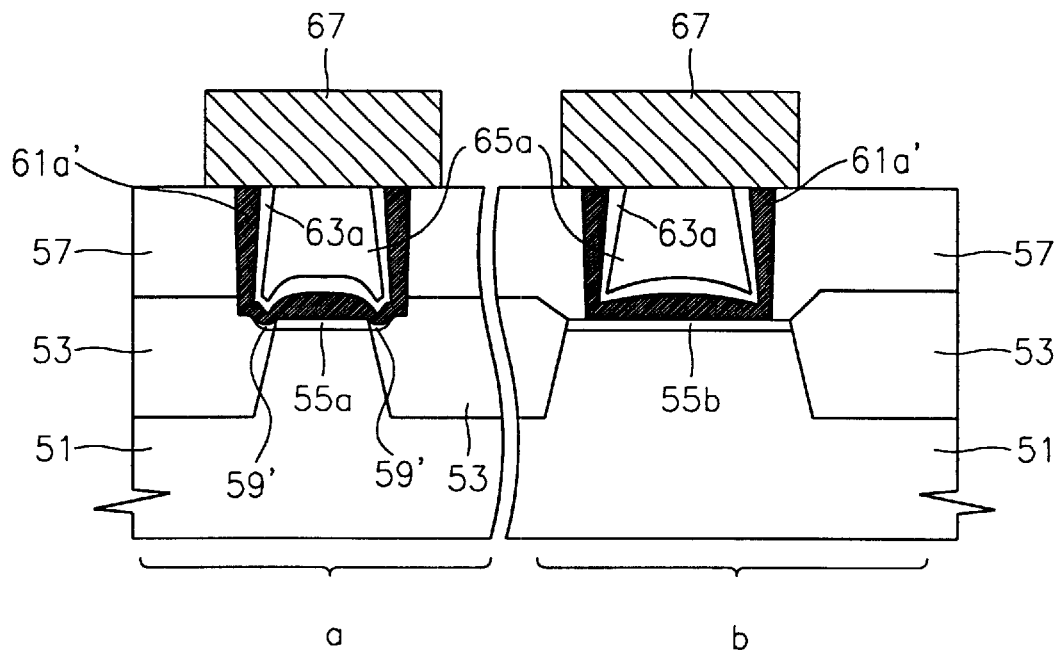

Referring to FIG. 11, the refractory metal layer 65, the barrier metal layer 63, the unreacted ohmic metal layer 61, and the compound layer 61a are sequentially planarized until the upper surface of the inter-dielectric layer 57 is exposed, thereby forming a compound material liner 61a', a barrier metal liner 63a, and a contact plug 65a within the first and second metal contact holes H1' and H2'. The planarization can be performed by CMP or blanket-etching. A metal layer, for example, an aluminum layer or aluminum alloy layer, is formed on the entire surface of the semiconductor substrate on which the contact plug 65a has been formed. The metal layer is patterned, resulting in a metal interconnection 67 which contacts the contact plug 65a.

Figure 12:
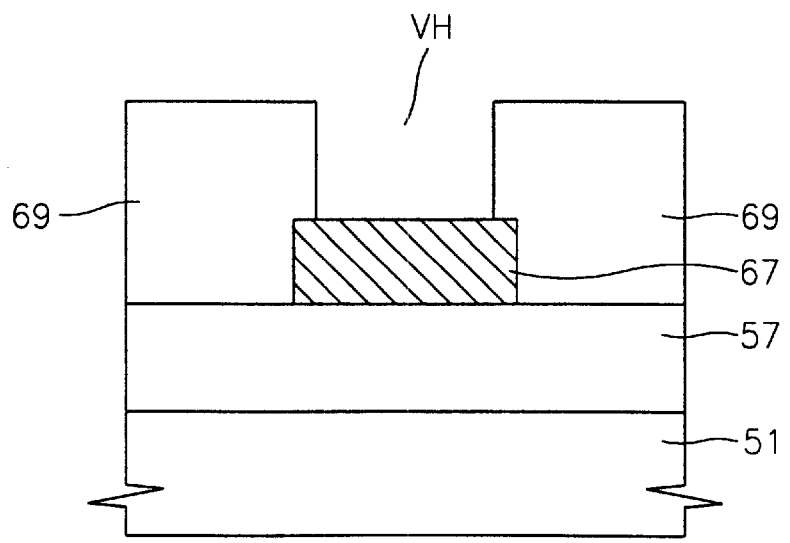
FIGS. 12 through 15 are cross-sectional views illustrating a method of forming a metal contact structure, according to another embodiment of the present invention.
Figure 13:
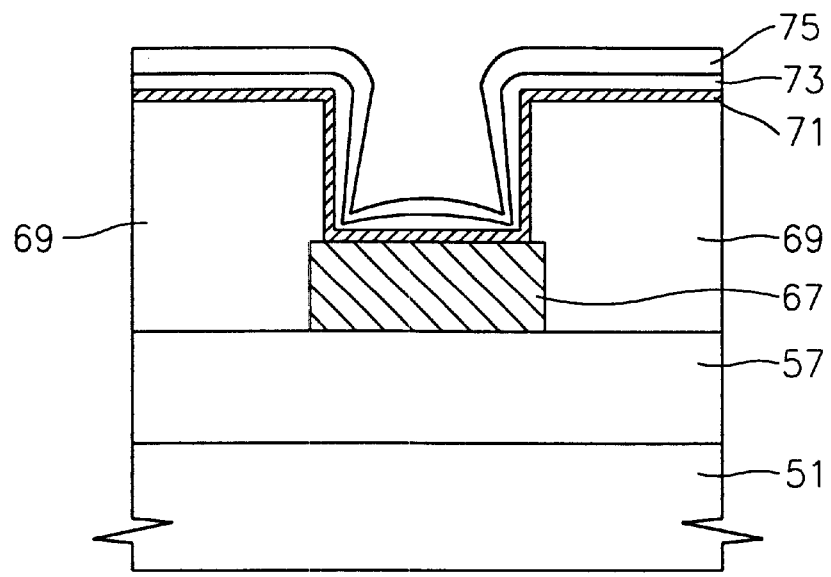

FIGS. 12 through 15 are cross-sectional views illustrating a method of forming a metal contact structure, according to another embodiment of the present invention Referring to FIGS. 12 and 13, an insulative layer 57 is formed on the semiconductor substrate 51. A lower interconnection 67 is formed on a predetermined region of the insulative layer 57. The lower interconnection 67 is formed of doped silicon, metallic polycide, or metal. An inter-dielectric layer 69 is formed on the entire surface of the semiconductor substrate on which the lower interconnection 67 has been formed. The insulative layer 57 and the inter-dielectric layer 69 are formed by the same method as the method by which the inter-dielectric layer 57 is formed as described above referring to FIGS. 7 through 11. The inter-dielectric layer 69 is patterned to form a contact hole VH which exposes a predetermined region of the lower interconnection 67. A semiconductor layer 71, an ohmic metal layer 73 and a barrier metal layer 75 are formed on the entire surface of the semiconductor substrate on which the contact hole VH has been formed, by the same method as the method which is described above referring to FIG. 9.

Figure 14:
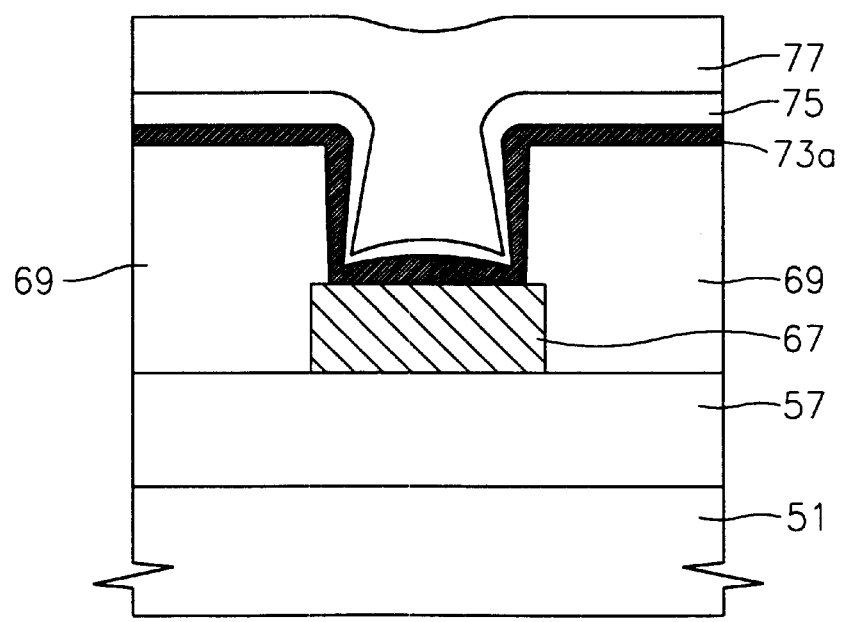
Figure 15:
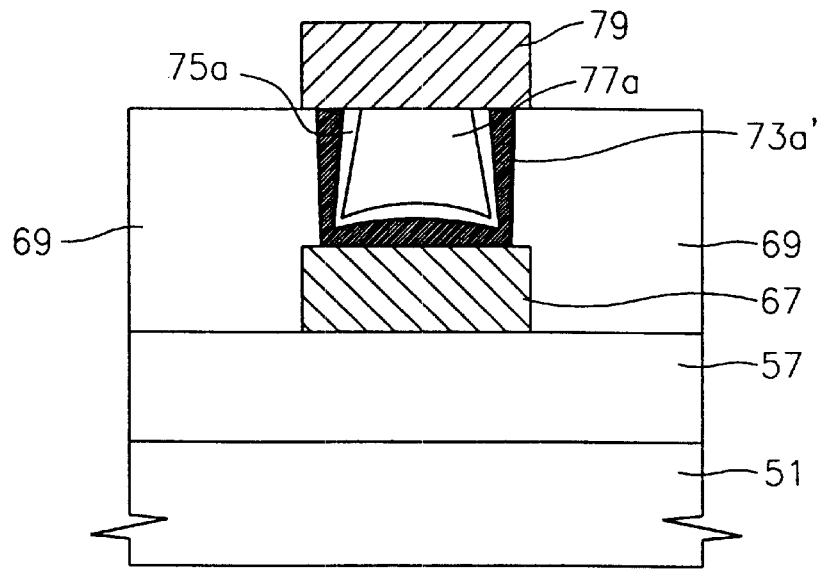

Referring to FIGS. 14 and 15, the resultant structure on which the barrier metal layer 75 has been formed is thermally treated by the same method as the method which is described above referring to FIG. 10, thereby reacting the semiconductor layer 71 with the ohmic metal layer 73. Thus, a compound material layer 73a (i.e., a titanium silicide layer) having a uniform thickness is formed on the bottoms and sidewalls of the contact hole VH and also on the upper surface of the inter-dielectric layer 69. Here, the thermal treatment can be performed before the barrier metal layer 75 is formed, as described above with reference to FIG. 10. In this case, it is preferable that the ohmic metal layer 73 which does not react with the semiconductor layer 71, that is, an unreacted ohmic metal layer, is removed by a wet-etching solution. After the unreacted ohmic metal layer is removed, the barrier metal layer 75 may be formed. Alternatively, a new ohmic metal layer and the barrier metal layer 75 may be formed.

A refractory metal layer 77 for filling the contact hole, for example, a tungsten layer, is formed on the entire surface of the resultant semiconductor substrate on which the compound material layer 73a and the barrier metal layer 75 have been formed, by the same method as the method which is described above referring to FIG. 10. At this time, the compound material layer 73a, which is formed to a uniform thickness on the bottoms and lower corners of the contact hole VH, can prevent fluorine decomposed from the $WF_6$ gas, from penetrating into the lower interconnection 67. Consequently, formation of voids within the lower interconnection 67 can be prevented. The refractory metal layer 77, the barrier metal layer 75, and the compound material layer 73a are sequentially planarized until the upper surface of the inter-dielectric layer 69 is exposed, resulting in a compound material liner 73a', a barrier metal liner 75a, and a contact plug 77a within the contact hole VH. A metal interconnection 79 is formed on the contact plug 77a by the same method as the method described above referring to FIG. 11.

Figure 16:
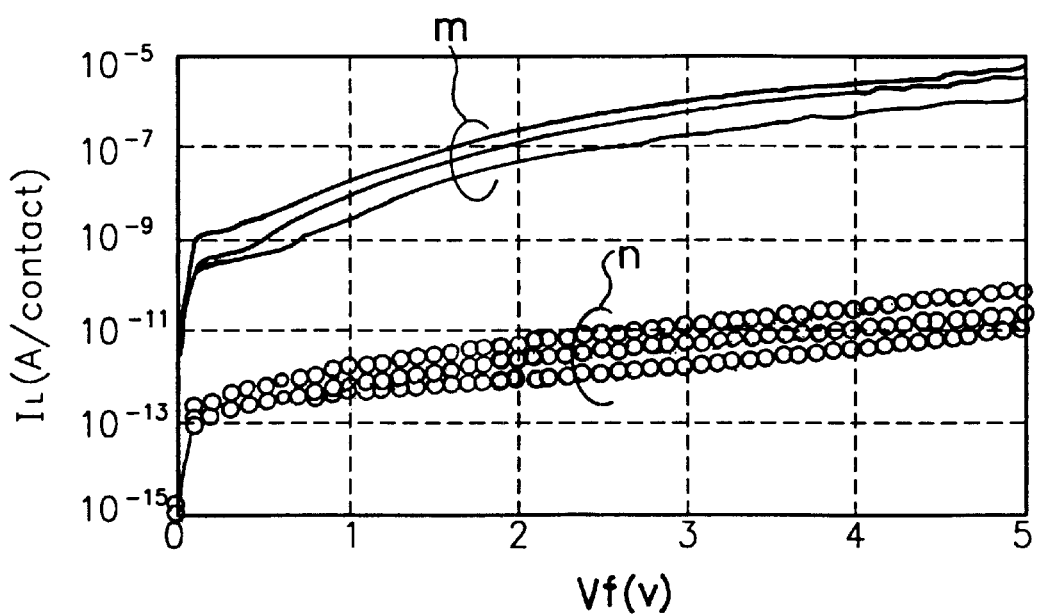
FIG. 16 is a graph showing the results of measurement of the leakage current characteristics of each of the metal contact structures which are manufactured according to the present invention and the prior art.

FIG. 16 is a graph showing the results of measurement of the junction leakage current of a metal contact structure which is manufactured according to the present invention, and the junction leakage current of a metal contact structure which is manufactured according to the prior art. Here, data indicated by reference character "m" denotes the junction leakage current of a metal contact structure which is manufactured according to the prior art, and data indicated by reference character "n" denotes the junction leakage current of a metal contact structure which is manufactured according to the present invention. Here, actual metal contact structures manufactured according to the present invention and the prior art have a structure in which a predetermined region of an impurity layer and a predetermined region if an isolation layer adjacent to the impurity layer are exposed by a metal contact hole. In FIG. 16, the horizontal axis indicates a reverse bias voltage Vf which is applied between an impurity layer and a semiconductor substrate, and the vertical axis indicates a junction leakage current $I_L$ which flows via a metal contact hole, with respect to the reverse bias voltage.

In a method of forming the metal contact structure according to the present invention having the junction leakage current characteristics shown in FIG. 16, first, an isolation layer is formed on a predetermined region of a P-type semiconductor substrate by trench isolation. Here, the depth of a trench region is 0.35 μm. The isolation layer is formed of silicon oxide. Arsenic (As) ions are implanted into the active region between adjacent isolation layers, at an energy of 30 KeV and at a dose of $3.0 \times 10^{15}$ atoms/$cm^2$. Then, the resultant structure is thermally treated at 850° C. for 30 minutes under a nitrogen atmosphere, resulting in an N-type impurity layer. A 12000 Å silicon oxide layer is formed by CVD, on the entire surface of the semiconductor substrate on which the N-type impurity layer has been formed. The silicon oxide layer acts as an inter-dielectric layer. The inter-dielectric layer, that is, a chemical vapor deposited (CVD) silicon oxide layer, is planarized by CMP, thereby forming a 7000 Å inter-dielectric layer on the N-type impurity layer. The planarized inter-dielectric layer is patterned, thereby forming a metal contact hole which exposes the N-type impurity layer and an isolation layer adjacent to the N-type impurity layer. Here, the metal contact hole is formed until the N-type impurity layer and an isolation layer adjacent to the N-type impurity layer are exposed. Also, the metal contact hole is formed using a photomask on which a square pattern whose side is 0.3 μm has been drawn.

Then, a 300 Å amorphous silicon layer is formed by LPCVD, on the entire surface of the semiconductor substrate on which the metal contact hole has been formed. Here, the LPCVD is performed at 520° C. using a silane ($SiH_4$) gas as a reaction gas. A 600 Å first titanium layer is formed on the entire surface of the resultant structure on which the amorphous silicon layer has been formed, by sputtering at a deposition temperature of 100° C. The resultant structure on which the first titanium layer has been formed is thermally treated for 30 seconds at 650° C. under a nitrogen atmosphere by rapid thermal processing (RTP), thereby forming a titanium silicide layer obtained by reacting the amorphous silicon layer with the first titanium layer. Next, an unreacted first titanium layer, which remains unreacted with the amorphous silicon layer, is removed by a sulfuric acid solution. A 100 Å second titanium layer and a 600 Å titanium nitride layer are sequentially formed on the entire surface of the semiconductor substrate from which the unreacted first titanium layer has been removed, by sputtering. Then, the resultant structure on which the titanium nitride layer has been formed is re-annealed for 30 seconds at 650° C. under a nitrogen atmosphere. A tungsten layer for filling the metal contact hole is formed by CVD to have a thickness of 4000 Å on the entire surface of the re-annealed resultant structure. Thereafter, the tungsten layer is planarized by CMP to form a contact plug, and an aluminum interconnection is formed on the contact plug.

In manufacturing the conventional metal contact structure having the junction leakage current characteristics shown in FIG. 16 the formation of the amorphous silicon layer and the first titanium layer, the thermal treatment for reacting the amorphous silicon layer with the first titanium layer, and the removal of the unreacted first titanium layer are omitted.

Referring to FIG. 16, the metal contact structure manufactured according to the prior art provides a leakage current of about $1 \times 10^{-6}$ Ampere at a reverse bias of 5V, but the metal contact structure manufactured according to the present invention provides a leakage current of about $1 \times 10^{-11}$ Ampere at the reverse bias of 5V. In other words, the junction leakage current characteristics of the metal contact structure manufactured according to the present invention are significantly improved as compared to those of the metal contact structure manufactured according to the prior art.

According to the present invention as described above, thermal treatment is performed after a semiconductor layer, an ohmic metal layer and a barrier metal layer are sequentially formed on the entire surface of a semiconductor substrate on which a metal contact hole or a contact hole has been formed. Accordingly, a compound material layer for blocking impurities can be formed to have a uniform thickness on the bottom of a contact hole such as a metal contact hole and also on the lower corners thereof. Consequently, a contaminant such as fluorine can be prevented from penetrating into a lower interconnection when a contact plug is formed of a refractory metal (e.g., tungsten) within the contact hole surrounded by the barrier metal layer. Therefore, increases in a contact resistance can be prevented.

Also, after a metal contact hole for exposing an impurity layer and portions of isolation layers adjacent to the impurity layer is formed to maximize the contact area of the impurity layer, semiconductor layer residues can be filled in recessed regions which expose the sidewalls of the impurity layer. This prevents a compound material layer formed on the impurity layer from directly contacting the semiconductor substrate below the impurity layer. Consequently, the junction leakage current characteristics of the impurity layer can be improved.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method of forming a contact structure of a semiconductor device, comprising:

forming an insulating layer on a semiconductor substrate;

forming a lower interconnection structure on a the insulating layer;

forming an inter-dielectric layer on the insulating layer and the lower interconnection structure;

forming a contact hole which exposes a predetermined region of the lower interconnection structure by patterning the inter-dielectric layer;

forming a conformal semiconductor layer on the entire surface of the inter-dielectric layer including within the contact hole;

forming an ohmic metal layer on the conformal semiconductor layer;

forming a compound material layer by reacting the semiconductor layer with the ohmic metal layer, by thermally treating the ohmic metal layer;

removing an unreacted ohmic metal layer, which does not react with the semiconductor layer upon the thermal treatment using a wet-etching polution; and forming a barrier metal layer on the entire surface of the resultant structure from which the unreacted ohmic metal layer has been removed.

2. The method claim 1, wherein the conformal semiconductor layer is formed of a material selected from the group consisting of undoped silicon (Si), undoped germanium (Ge) and undoped silicon germanium (SiGe).

3. The method of claim 1, wherein the ohmic metal layer and the barrier metal layer are formed of titanium and titanium nitride, respectively.

4. The method of claim 1, wherein the thermal treatment is performed at 600 to 700° C. under a nitrogen atmosphere.

5. The method of claim 1, after the step of forming the barrier metal layer, further comprising:

forming a refractory metal layer for filling the contact hole, on the entire surface of the semiconductor substrate on which the barrier metal layer has been formed;

sequentially planarizing the refractory metal layer, the barrier metal layer and the compound material layer until the upper surface of the inter-dielectric layer is exposed, thereby sequentially forming a compound material liner and a barrier metal liner on the bottom and sidewalls of the contact hole and simultaneously forming a contact plug for filling the region surrounded by the barrier metal liner; and forming a metal interconnection on the contact plug.

6. The method of claim 5, wherein the refractory metal layer is formed of tungsten.

7. A method of forming a contact structure of a semiconductor device, comprising:

forming an isolation layer for defining an active region, on a predetermined area of a semiconductor substrate;

forming an impurity layer by implanting impurities having a different conductivity type than the conductivity type of the semiconductor substrate onto the surface of the active region;

forming an inter-dielectric layer on the entire surface of the semiconductor substrate on which the impurity layer has been formed;

forming a contact hole which exposes a predetermined region of the impurity layer and has a recessed region, which is an etched portion of the isolation layer adjacent to the exposed impurity layer, by patterning the inter-dielectric layer;

forming a silicon layer residue which contacts the sidewalls of the exposed impurity layer, within the recessed region;

forming a metal silicide liner which covers the sidewalls of the contact hole, the surface of the exposed impurity layer, and the silicon layer residue;

forming a barrier metal liner on the metal silicide liner; and forming a contact plug for filling the region surrounded by the barrier metal liner.

8. The method of claim 7, wherein the isolation layer is formed by trench isolation.

9. The method of claim 7, wherein the steps of forming the silicon layer residue, the metal silicide liner, the barrier metal liner and the contact plug comprise:

sequentially forming a silicon layer and an ohmic metal layer on the entire surface of the semiconductor substrate on which the contact hole has been formed;

forming a metal silicide layer obtained by reacting the ohmic metal layer with the silicon layer, and simultaneously forming the silicon layer residue which contacts the sidewalls of the exposed impurity layer, within the recessed region, by thermally processing the ohmic metal layer;

forming a barrier metal layer on the entire surface of the semiconductor substrate on which the metal silicide layer and the 'silicon layer residue have been formed;

forming a refractory metal layer for filling the contact hole, on the entire surface of the semiconductor substrate on which the barrier metal layer has been formed; and sequentially planarizing the refractory metal layer, the barrier metal layer, and the metal silicide layer, until the upper surface of the inter-dielectric layer is exposed.

10. The method of claim 9, after the step of forming the metal silicide layer, further comprising removing a portion of the ohmic metal layer which does not react with the silicon layer upon thermal treatment.

11. The method of claim 7, wherein the silicon layer residue is an undoped polycrystalline silicon layer.

12. The method of claim 7, wherein the silicon layer residue is an undoped amorphous silicon layer.

13. The method of claim 9, wherein the ohmic metal layer and the barrier metal layer are a titanium layer and a titanium nitride layer, respectively.

14. The method of claim 7, further comprising forming a metal interconnection on the contact plug.

15. The method of claim 7, wherein the contact plug is a tungsten layer.

16. A method of forming a contact structure of a semiconductor device, comprising:

forming an isolation layer for defining an active region, on a predetermined area of a semiconductor substrate;

forming an impurity layer by implanting impurities having a different conductivity type than the conductivity type of the semiconductor substrate onto the surface of the active region;

forming an inter-dielectric layer on the entire surface of the semiconductor substrate on which the impurity layer has been formed;

forming a contact hole which exposes a predetermined region of the impurity layer and has a recessed region, which is an etched portion of the isolation layer adjacent to the exposed impurity layer, by patterning the inter-dielectric layer;

forming a conformal silicon layer on the entire surface of the inter-dielectric layer including within the contact hole;

sequentially forming an ohmic metal layer and a barrier metal layer on the silicon layer, the ohmic metal layer being thinner in proximity to the recessed region than in other regions due to reduced step coverage of the ohmic metal layer in the recessed region;

forming a metal silicide layer by reacting the ohmic metal layer with the silicon layer, and simultaneously forming silicon layer residues within the recessed region, by thermally processing the semiconductor substrate on which the barrier metal layer has been formed, the silicon layer residues being formed in the recessed region from portions of the silicon remaining unreacted with the ohmic metal layer due to the comparative thinness of the ohmic metal layer in proximity to the recessed region; and forming a contact plug for filling the contact hole surrounded by the barrier metal layer.

17. The method of claim 16, wherein the isolation layer is formed by trench isolation.

18. The method of claim 16, wherein the silicon layer is an undoped polycrystalline silicon layer.

19. The method of claim 16, wherein the silicon layer is an undoped amorphous silicon layer.

20. The method of claim 16, wherein the ohmic metal layer and the barrier metal layer are a titanium layer and a titanium nitride layer, respectively.

21. The method of claim 16, further comprising forming a metal interconnection on the contact plug.

22. The method of claim 16, wherein the contact plug is a tungsten layer.

* * * * *